(12) United States Patent
Strnad

(10) Patent No.: US 6,326,858 B1
(45) Date of Patent: Dec. 4, 2001

(54) OSCILLATOR CIRCUIT WITH THERMAL FEEDBACK

(75) Inventor: Richard Strnad, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/618,107

(22) Filed: Jul. 17, 2000

(51) Int. Cl.$^7$ ....................................................... H03B 5/00
(52) U.S. Cl. ................... 331/107 R; 331/66; 331/108 R; 331/176
(58) Field of Search .................. 331/66, 108 R, 331/108 L, 175, 176, 177 R, 187, 107 R

(56) References Cited

U.S. PATENT DOCUMENTS 3,393,328 * 7/1968 Meadows et al. ........... 331/108 R X

* cited by examiner

Primary Examiner—David Mis
(74) Attorney, Agent, or Firm—Stallman & Pollock LLP

(57) ABSTRACT

An oscillator circuit which translates energy between electromagnetic energy and thermal energy is disclosed. The control loop of the oscillator includes a feed forward stage and a feedback stage for establishing the necessary conditions for oscillation. The signal at the output of the oscillator circuit is applied to the input of the feedback stage and the electromagnetic energy of the output signal is translated into thermal energy by a thermal element. The thermal energy is then translated back into electromagnetic energy by a thermal sensing element to generate an electronic feedback control signal. The electronic feedback control signal is then used to control the input of the feed forward stage such that the closed loop response of the system results in a periodic signal at the output of the circuit.

19 Claims, 6 Drawing Sheets

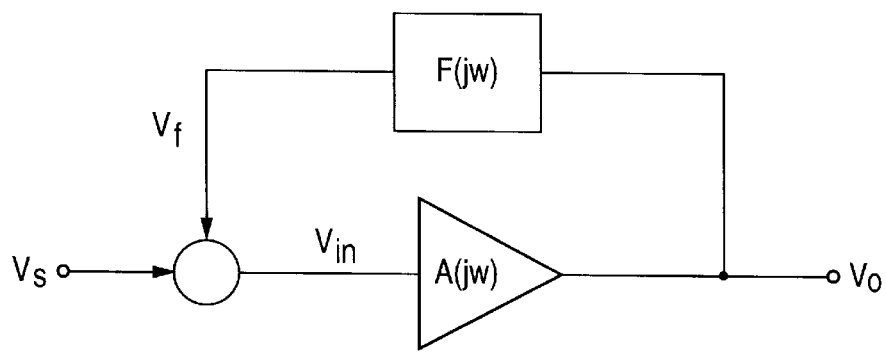
FIG. 1
(PRIOR ART)
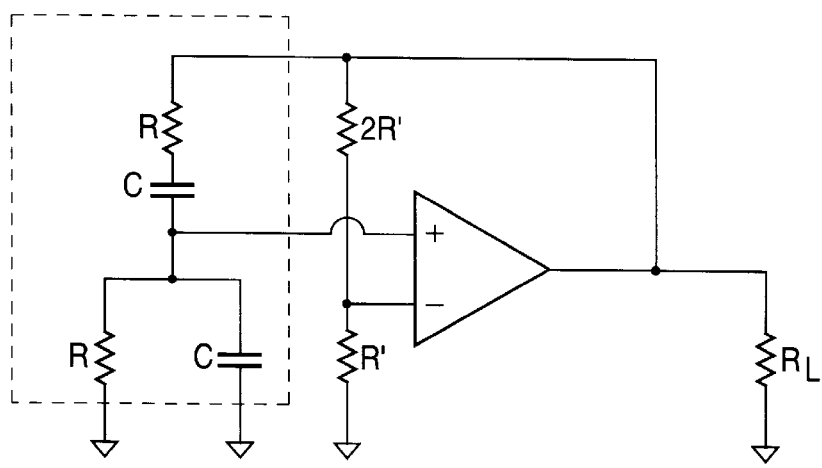
FIG. 2
(PRIOR ART)
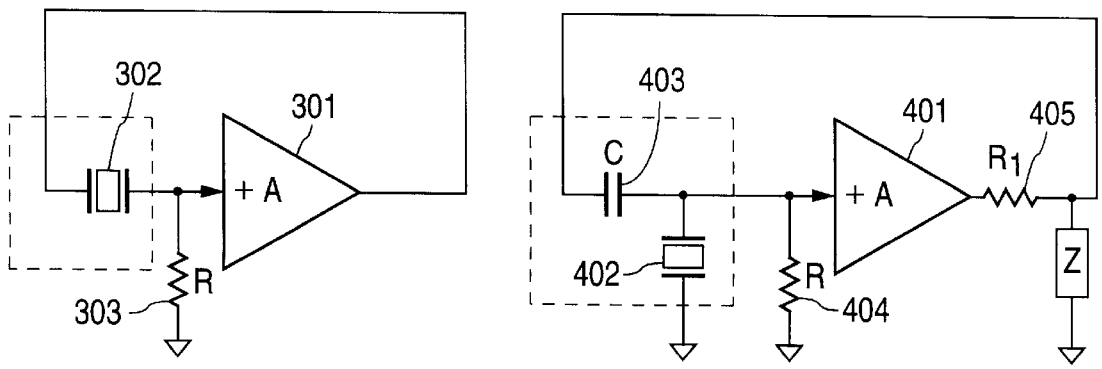
FIG. 3
(PRIOR ART)
FIG. 4
(PRIOR ART)

OSCILLATOR CIRCUIT WITH THERMAL FEEDBACK

FIELD OF THE INVENTION

The present invention relates to systems which use periodic electronic signals, and in particular, to electronic systems with oscillation circuits that generate periodic electronic signals for use in other parts of the electronic system.

BACKGROUND OF THE INVENTION

Electronic systems commonly utilize electronic signals for processing information or performing specified functions. Electronic signals are time varying voltage or current values that occur at various specified portions of the electronic system. For example, a particular circuit node may experience a particular change in voltage over time. Moreover, such a change in the voltage may take on recurring values over time in a regular manner (i.e. the voltage on the node is periodic). Typically, time varying voltages and currents are compared, added, subtracted. multiplied, or otherwise processed to perform various functions corresponding to the particular type of electronic system. In order to more efficiently carry out such processing, many electronic systems utilize circuits which generate an electronic signal with a constant period. Such circuits are known as oscillator circuits and are found in many types of electronic systems.

Generally, an oscillator circuit is a device for periodically transferring electrical energy between components. FIG. 1 illustrates a closed loop architecture commonly employed for oscillator circuits. The oscillator circuit of FIG. 1 is comprised of a feed forward stage and a feedback stage. Amplifiers are commonly used in the feed forward stage to produce the periodic electronic output signal Vo so that the oscillations will continue indefinitely without damping out. The feedback stage receives the periodic electronic output signal Vo and generates a feedback control signal Vf which is either added, subtracted or in some other way combined with the system input signal Vs to control the periodic electronic input signal Vin at the feed forward stage. In order for the closed loop architecture of FIG. 1 to achieve steady state oscillation, the amplifier $A(j\omega)$ must provide sufficient gain, and the feedback stage $F(j\omega)$ must shift the phase of the output signal a sufficient amount such that the feedback control signal is in phase with the input signal. The mathematical expression of these requirements can be established by following the signal flow around the feedback loop. The gain of the amplifier can be written as $$Vo = Vin A(j\omega).$$

The gain around the loop can be established as $$Vf = Vo\ F(j\omega) = Vin A(j\omega) F(j\omega),$$

and the transfer function of the system is $$Vf/Vin = A(j\omega) F(j\omega).$$

Therefore, the magnitude and phase conditions for oscillation can be shown as:

$$|Vf/Vin| = |A(j\omega)||F(j\omega)| \geq 1.0 \quad \phi_A + \phi_B = 0°$$

where $\phi_A$ and $\phi_B$ are the phase shifts associated with the amplifier and feedback network respectively.

Oscillator circuits according to the architecture of FIG. 1 can be implemented in a variety of ways. The underlying characteristic common to each implementation is the idea that electric energy is transferred between various parts of the system during oscillation cycles. For example, some oscillator circuits charge or discharge an inductor or capacitor during the alternate phases of the oscillation cycle. The use of inductors and/or capacitors for storing and discharging energy is an example of an oscillation system which transfers electromagnetic energy between two or more devices capable of storing electromagnetic energy. An example of a well-known oscillation system that utilizes the transformation of electromagnetic energy is the Wien-Bridge Oscillator shown in FIG. 2. The feedback stage of the Wien-Bridge Oscillator uses a resistor and capacitor network for alternately storing and discharging electromagnetic energy according to principles well-known by those skilled in the art.

Other well known oscillator circuits employ energy storage elements that store mechanical energy during the course of an oscillation cycle. A crystal oscillator is a typical example. In a crystal oscillator, electromagnetic energy is transferred into mechanical energy by applying an electric signal across the crystal structure, thereby causing the crystal lattice to change its physical orientation. Such a change in orientation is achieved by the absorption of electromagnetic energy. For example, in a quartz crystal oscillator, a voltage applied across the crystal will cause the crystal to move sideways internally in a thickness shear movement. Moreover, a quartz crystal can be modeled as a damped LC circuit, and will have a resonant frequency corresponding to the physical properties of the crystal structure. Examples of two oscillator circuits that utilize the mechanical energy storage properties of quartz crystals are shown in FIG. 3 and FIG. 4. The oscillator circuit of FIG. 3 utilizes a feed forward stage comprised of a amplifier 301. The feedback stage utilizes a quartz crystal 302 in a series configuration. In this configuration electrical energy at the resonant frequency of the quartz crystal 302 is transferred into mechanical energy in the crystal structure, and then back into electrical energy at the input of the amplifier. FIG. 4, on the other hand, shows a shunt oscillator circuit with feedback stage comprised of a series capacitor 403 and a shunt quartz crystal 402. The shunt oscillator circuit of FIG. 4 includes a 90° phase lag network using a shunt impedance 406 and the amplifier's source resistance, illustrated by resistor 405, to provide the phase lag. The lag network is required to compensate for the 90° phase shift introduced by capacitor 403 to bring the total phase around the loop to 0° as required for oscillation. In both series and shunt configurations of FIG. 3 and FIG. 4 respectively, the crystal is being used to transfer electromagnetic energy into mechanical energy during alternate phases of the oscillation cycle.

However, electromagnetic and mechanical storage elements share a common problem. In an effort to reduce costs, electronic system designers strive to integrate various components onto a single semiconductor integrated circuit while utilizing a minimal amount of semiconductor area. Unfortunately electromagnetic storage elements such as capacitors and inductors typically occupy large areas of semiconductor area and are, therefore, often provided by external discrete components that occupy large areas on the printed circuit board and correspondingly increasing system costs. Mechanical storage elements also are traditionally provided as external discrete components which also occupy large areas on the printed circuit board and correspondingly increase system costs. Therefore, there is a need to find other solutions for enabling oscillation circuits which can be fully integrated onto a single semiconductor integrated circuit.

SUMMARY OF THE INVENTION

The present invention relates to an oscillation circuit that translates electrical energy into thermal energy in the feedback stage of the circuit to generate a periodic electronic signal at the output of the circuit. The oscillator circuit according to the present invention includes a feed forward stage that receives a periodic electronic input signal on an input node and produces a periodic electronic signal on an output node. The oscillator circuit also includes a feedback stage coupled to the output node to receive the output signal, and in accordance therewith, generate a thermal feedback signal for controlling the input node.

The feedback stage of the present invention includes a thermal element to produce a thermal feedback signal and a thermal sensing element to receive the thermal feedback signal. The thermal signal is produced by the thermal element in response to the periodic electronic output signal. The thermal element translates the energy in the periodic electronic output signal into thermal energy in the form of a thermal signal. This energy translation is achieved according to the Peltier Effect. Peltier heating and cooling at the junctions of dissimilar metals establishes a differential thermal signal that stores electromagnetic energy. The electromagnetic energy is then translated back into electrical energy by the action of a thermal sensing element. In one embodiment, the thermal sensing element includes two connection lines and a bridge element. In another embodiment, the thermal sensing element includes two PN-junctions integrated on a semiconductor. In yet another embodiment, the thermal sensing element includes two NPN transistors connected as diodes.

Features and advantages of the present invention will be understood upon consideration of the following detailed description of the invention and the accompanying drawings.

BRIEF DESCRIPTION OF THE DRAWINGS

The present invention is illustrated by way of example and not limitation in the figures of the accompanying drawings, in which like references indicate similar elements and in which:

FIG. 1 is a diagram of a prior art oscillator loop architecture.

FIG. 2 is a diagram of a prior art oscillator circuit utilizing electronic components in the feedback stage for the storage of electromagnetic energy.

FIG. 3 is a diagram of a prior art oscillator circuit utilizing a crystal in the feedback stage for the storage of mechanical energy in series configuration.

FIG. 4 is a diagram of a prior art oscillator circuit utilizing a crystal in the feedback stage for the storage of mechanical energy in shunt configuration.

DETAILED DESCRIPTION OF THE INVENTION

Figure 5:
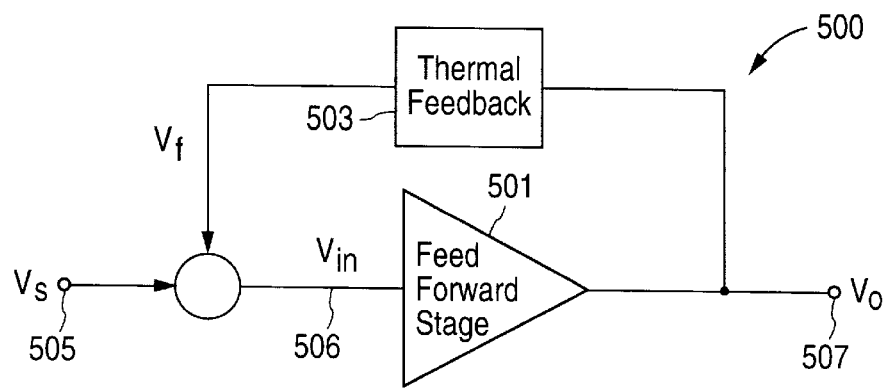
FIG. 5 is a diagram of an oscillator circuit loop architecture utilizing thermal feedback in accordance with the present invention.

Referring to FIG. 5, an oscillator circuit 500 for an electronic system is shown. The oscillator circuit 500 includes a feed forward stage 501 and a feedback stage 503 utilizing thermal feedback. The feedback stage of the present invention utilizes thermal elements and thermal feedback signals to store and discharge energy during alternate phases of the oscillator circuit's oscillation cycles. Oscillator circuit 500 receives a system input signal Vs on an system input node 505. The system input signal is either added, subtracted, or electrically combined in some other way well known by those skilled in the art with an electronic feedback control signal Vf from the feedback stage to control a periodic electronic input signal Vin at the input node 506 of the feed forward stage 501. The output of feed forward stage 501 produces a periodic electronic output signal Vo on output node 507. The periodic electronic output signal of the oscillator circuit is then coupled to other portions of the electronic system to facilitate signal processing in the electronic system. The periodic electronic output signal is also applied to the input of the feedback stage 503 to form a closed loop. Feedback stage 503 receives the output signal and translates the electric energy in the output signal into thermal energy. Thermal energy is stored in feedback stage 503 and then translated back into electrical energy to generate an electronic feedback control signal Vf. The electronic feedback control signal Vf is used to control the periodic electronic input signal Vin of the feed forward stage such that the system will act as an oscillator. In one embodiment of the oscillator circuit 500, the system input signal Vs on system input node 505 will act only as a start up signal and will be zero during normal operation. Such a startup signal may be any perturbation of the system input node such as a pulse or the inherent noise of a resistor, for example.

Figure 6:
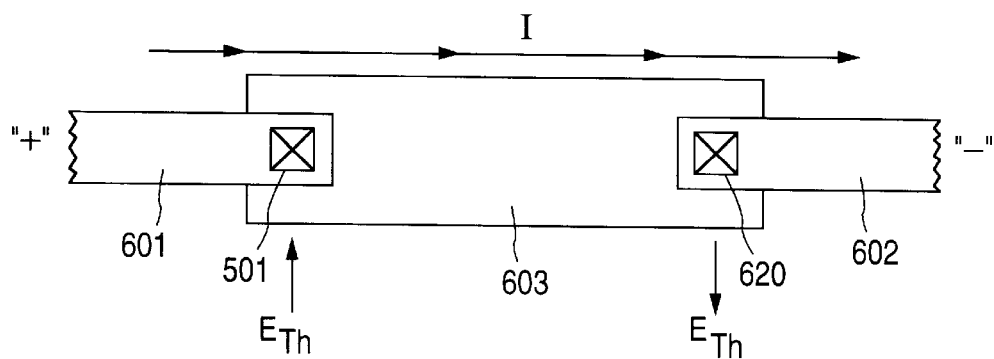
FIG. 6 shows a top view of a thermal element according to one embodiment of the present invention.

FIG. 6 illustrates a thermal element of the present invention. Thermal element 600 is used to generate a thermal feedback signal in feedback stage 503. Thermal element 600 includes a first connection line 601 and a second connection line 602 which are connected in series across a bridge element 603. Connection lines 601 and 602 can be, for example, metallizations on an integrated circuit composed of electrically conducting materials. The connection lines 601 and 603 can also be sized according to different dimensions. On an integrated circuit, for example, the connection lines are metallizations composed of aluminum or doped polysilicon. Other electrically conducting materials for the metallizations can be used as is well known by those skilled in the art. The bridge element 603, on the other hand, can be composed of a doped region of silicon on an integrated circuit, for example. The bridge element can be doped p-type or n-type. On an integrated circuit, a first connection line 601 formed of aluminum will contact a bridge element 603, formed of p-type silicon, at contact 610 to form a first aluminum/p-type silicon junction. Additionally, the bridge element 603 will contact a second connection line 602, also formed of aluminum, at contact 620 to form a second aluminum/p-type silicon junction.

Electrical energy can be translated into thermal energy by passing a current I through the junctions at contacts 610 and 620. For example, on an integrated circuit having first and second conduction lines 601 and 602 of aluminum and a bridge element 603 of p-type silicon, when a current I is passed from the aluminum to the p-type silicon at the contact 610, thermal energy Eth is absorbed. Additionally, when the current travels across the bridge element 603 and passes from the p-type silicon into the aluminum at contact 620, thermal energy Eth is released. This effects is known as the Peltier Effect. The Peltier Effect is a process by which electrical energy is converted into thermal energy. According to the Peltier Effect, if current is passed through a junction of dissimilar metals (here aluminum and p-type doped silicon), thermal energy is either released or absorbed. Therefore, as stated above for an aluminum/p-type silicon junction, when current flows from the aluminum into the p-type silicon region through the contact 610, the Peltier Effect causes thermal energy Eth to be absorbed and aluminum/p-type silicon junction at contact 610 will experience a reduction in temperature (i.e. the junction is cooled). On the other hand, when the current flows from the p-type silicon region and back into the aluminum through the contact 620, the Peltier Effect causes thermal energy Eth to be released and the aluminum/p-type silicon junction at contact 620 will experience an increase in temperature (i.e. the junction is heated). As is well-known by those skilled in the art, the release or absorption of thermal energy according to the Peltier Effect is dependent on the direction of current flow and the type of materials forming the junction. For example, changing the bridge element 603 from p-type silicon to n-type silicon would result in thermal energy being released at the location of contact 610 and absorbed at the location of contact 620 for the current I shown in FIG. 6. Additionally, other materials may be used for the connection lines 601 and 602 and bridge element 603 to translate the electrical energy into thermal energy as is well know by those skilled in the art.

Additionally, the thermoelectric property under discussion is reversible. When thermal energy is absorbed or extracted from a junction of dissimilar metals a voltage will be generated. This reverse effect is known as the Seebeck Effect. For the aluminum/p-type silicon junction, if thermal energy is introduced (i.e. the junction is heated), a positive voltage will form on the p-type silicon with respect to the voltage of the aluminum. Alternatively, if thermal energy is extracted from an aluminum/p-type silicon junction, a negative voltage will form on the p-type silicon with respect to the voltage of the aluminum. Therefore, the thermal element 600 of FIG. 6 can also act as a thermal sensor. If thermal energy is extracted from the junction at contact 610 and introduced into the junction at contact 620, then a positive voltage will be established on connection line 601 with respect to connection line 602. Alternately, if thermal energy is introduced into the junction at contact 610 and extracted from the junction at contact 620, then a positive voltage will be established on connection line 602 with respect to connection line 601.

Figure 7:
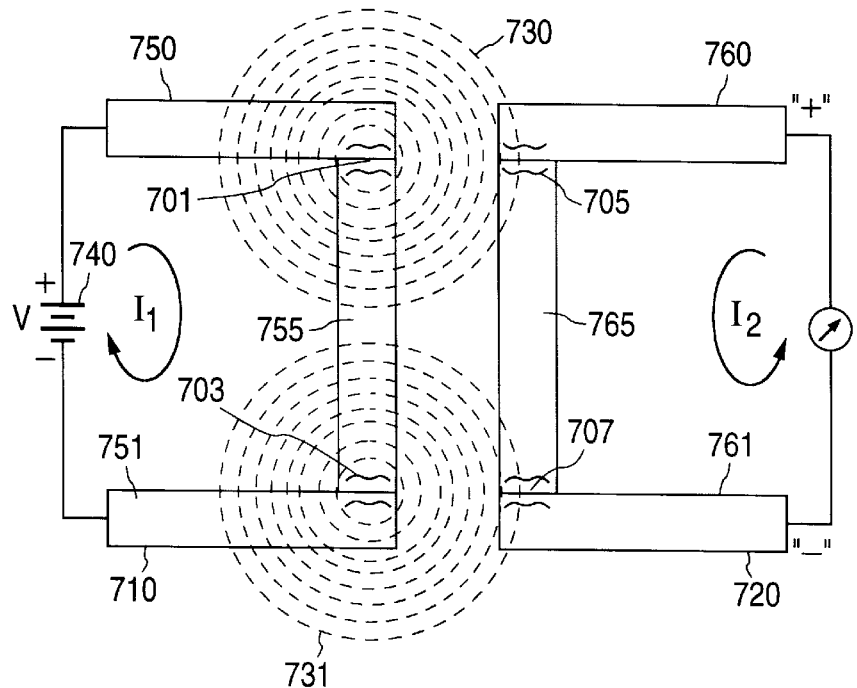
FIG. 7 shows a top view of a thermal feedback stage to illustrate the Peltier and Seebeck heat energy relation which is thermally coupled between the thermal element and a thermal sensing element.

FIG. 7 illustrates the interaction between a thermal element generating thermal energy according to the Peltier Effect and a thermal sensing element generating a voltage according to the Seebeck Effect. FIG. 7 shows a thermal element 710 comprising first and second connection lines 750 and 751 composed of aluminum, for example, and a bridge element 755 composed of p-type silicon, for example. Thermal element 710 has a voltage source 740 connected across connection lines 750 and 751, with the positive terminal connected to connection line 750 and the negative terminal connected to connection line 751. The thermal element 710 is absorbing thermal energy at junction 701 and releasing thermal energy at junction 703 according to the current I1 and the Peltier Effect. FIG. 7 also shows a thermal sensing element 720 comprised of connection lines 760 and 761 composed of aluminum, for example, and a bridge element 765 composed of p-type silicon, for example. Each of the junctions 705 and 707 of thermal sensing element 720 are positioned to thermally couple with thermal element junctions 701 and 703 respectively. The thermal gradients of opposite polarity make up the differential thermal signal. Therefore, as junction 701 absorbs energy, junction 705 will begin to drop in temperature as heat is extracted. Additionally, as junction 703 releases energy, junction 707 will begin to rise in temperature as heat is introduced. The thermal energy gradients are shown at 730 and 731 with 730 being a negative gradient representing a decreasing energy and 731 being a positive gradient representing an increasing energy. Therefore, the current I1 flowing in the thermal element 710 will set up a differential thermal signal that is coupled to the thermal sensing element 720. If the voltage on the thermal element is reversed, the change in direction of current flow will alternate the thermal processes as previously discussed and reverse the differential thermal signal. The corresponding changes in the temperatures of junctions 705 and 707 resulting from the thermal coupling will create positive or negative voltages on connection line 760 with respect to connection line 761, and a corresponding current I2 will begin to flow in accordance with the Seebeck Effect.

Figure 8:
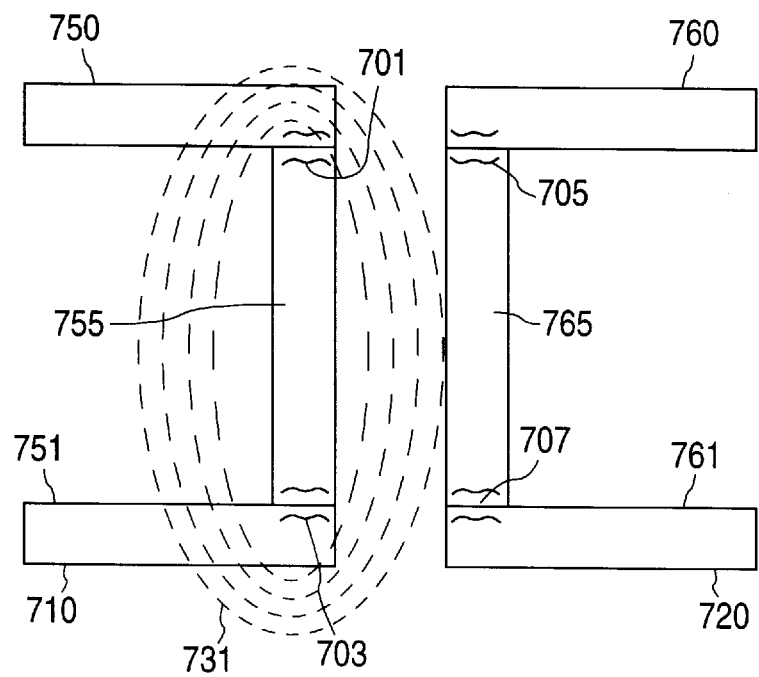
FIG. 8 shows a top view of a thermal feedback stage to illustrate both Peltier heat energy and joule heat energy.

FIG. 7, however, is an illustration of only Peltier heating. In addition to the Peltier Effect, thermal element 710 will also experience joule heating as a result of the current I1 flowing through the connection lines and bridge element. FIG. 8 illustrates the thermal gradient that will result when joule heating is taken into consideration. Joule heating will essentially offset the temperature differential caused by the Peltier Effect by an amount equal to the value of the heat energy generated by the current through the metal.

Figure 9:
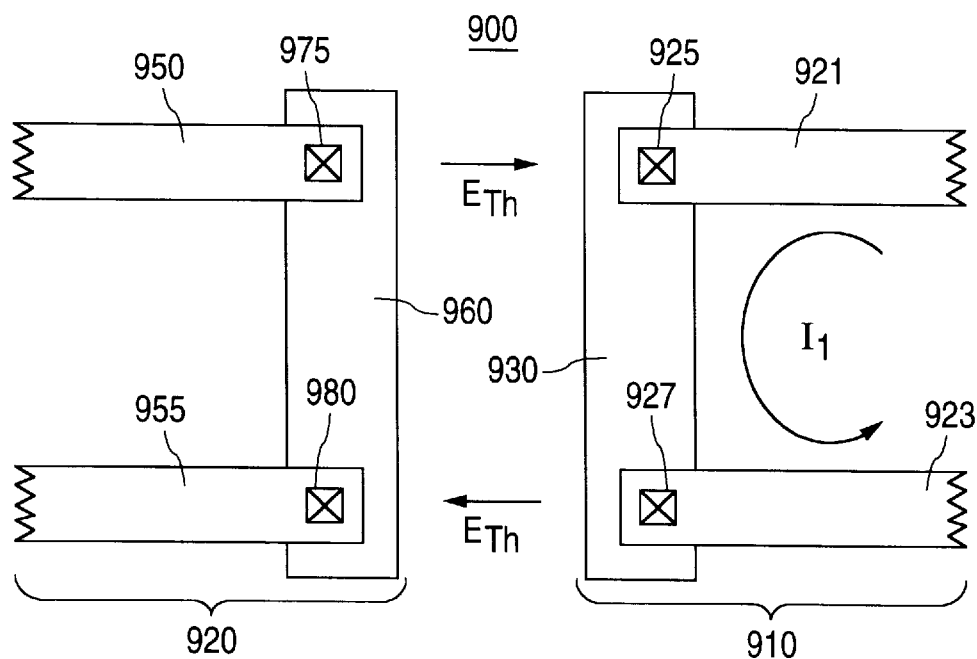
FIG. 9 shows a top view of a thermal feedback stage having a thermal element that is thermally coupled to a thermal sensing element according to one embodiment of the present invention.

FIG. 9 illustrates a feedback stage for achieving thermal feedback according to one embodiment of the present invention. Thermal feedback stage 900 includes a thermal element 910 and a thermal sensing element 920. Thermal element 910 includes a first connection line 921 and a second connection line 923. In one embodiment, the first and second connection lines are metallizations of aluminum on an integrated circuit, for example, but other types of electrically conductive materials are available as is well-known by those skilled in the art. Connection lines 921 and 923 are electrically connected across bridge element 930. In one embodiment, the bridge element p-type is doped silicon, but other types of electrically conductive materials are available for use as thermocouples as is well-known by those skilled in the art. Connection lines 921 and 923 form aluminum/p-type silicon junctions with the p-type silicon bridge element 930 at contacts 925 and 927. When a current I1 is passed from connection line 921 to connection line 923 through contacts 925 and 927, thermal energy Eth is absorbed at the aluminum/p-type silicon junction corresponding to contact 925 and released at the aluminum/p-type silicon junction corresponding to contact 927 according to the Peltier Effect previously discussed. If the current I1 is reversed, the thermal processes will be reversed and thermal energy Eth will be released at the junction corresponding to contact 925 and absorbed at the junction corresponding to contact 927. As a result, a differential thermal signal can be established by alternating the direction of current flow through the thermal element 910. The differential thermal signal is comprised of a negative thermal signal component corresponding to a decreasing thermal energy over time that is associated with a junction absorbing thermal energy in accordance with the Peltier Effect. The differential thermal signal is also comprised of a positive thermal signal component corresponding to an increasing thermal energy over time that is associated with a junction releasing thermal energy in accordance with the Peltier Effect.

Analogous to thermal element 910, a thermal sensing element 920 according to one embodiment of the present invention includes a first connection line 950 and a second connection line 955. In one embodiment, the first and second metal lines are aluminum, for example. Connection lines 950 and 955 are electrically connected across a bridge element 960. In one embodiment, the bridge element is p-type doped silicon. Connection lines 950 and 951 form aluminum/p-type silicon junctions with the p-type silicon bridge element 960 at contacts 975 and 980. Thermal sensing element 920 is placed in a location proximate to thermal element 910 to allow thermal coupling between the elements. A current I1 is passed through thermal element 910 such that the aluminum/p-type silicon junction at contact 925 absorbs thermal energy and the aluminum/p-type silicon junction at contact 927 releases thermal energy. The junction at contact 925, which is absorbing thermal energy, will produce a negative thermal gradient. The negative thermal gradient will grow as the junction absorbs more thermal energy. As the thermal gradient grows, it will propagate outward radially from the area around contact 925 to adjacent regions of the integrated circuit, thereby cooling the surrounding areas of the integrated circuit. This propagating negative thermal gradient is the negative thermal signal component of the differential thermal signal discussed above. Similarly, the junction at contact 927, which is releasing thermal energy, will produce a positive thermal gradient. The positive thermal gradient will grow as the junction releases more thermal energy. As the positive thermal gradient grows, it will propagate outward radially from the area around contact 927 to adjacent regions of the integrated circuit, thereby heating the surrounding areas of the integrated circuit. This propagating positive thermal gradient is the positive thermal signal component of the differential thermal signal discussed above.

The resulting differential thermal signal, comprised of the positive and negative thermal signal components, propagates to thermal sensing element 920. Thermal sensing element is thermally coupled to receive the differential thermal signal generated by thermal element 910. When the negative thermal signal component corresponding to energy absorbing junction 925 reaches the aluminum/p-type silicon junction at contact 975, thermal energy will be extracted and the junction will begin to cool. Additionally, when the positive thermal signal corresponding to energy releasing junction 927 reaches the aluminum/p-type silicon junction at contact 980, thermal energy will be introduced and the junction will begin to heat up. As a result of the thermal effect of the differential thermal signal on the thermal sensing element, a positive voltage will be generated on connection line 950 with respect to connection line 955. Therefore, if the periodic electronic output signal of an oscillator is coupled across connection lines 921 and 923 of the thermal element 910, then the electromagnetic energy will be translated into thermal energy by the Peltier Effect at the contacts 925 and 927. This thermal energy will be stored and later discharged back into electrical energy in accordance with the Seebeck Effect at the contacts 975 and 980 of thermal sensing element 920.

Figure 10:
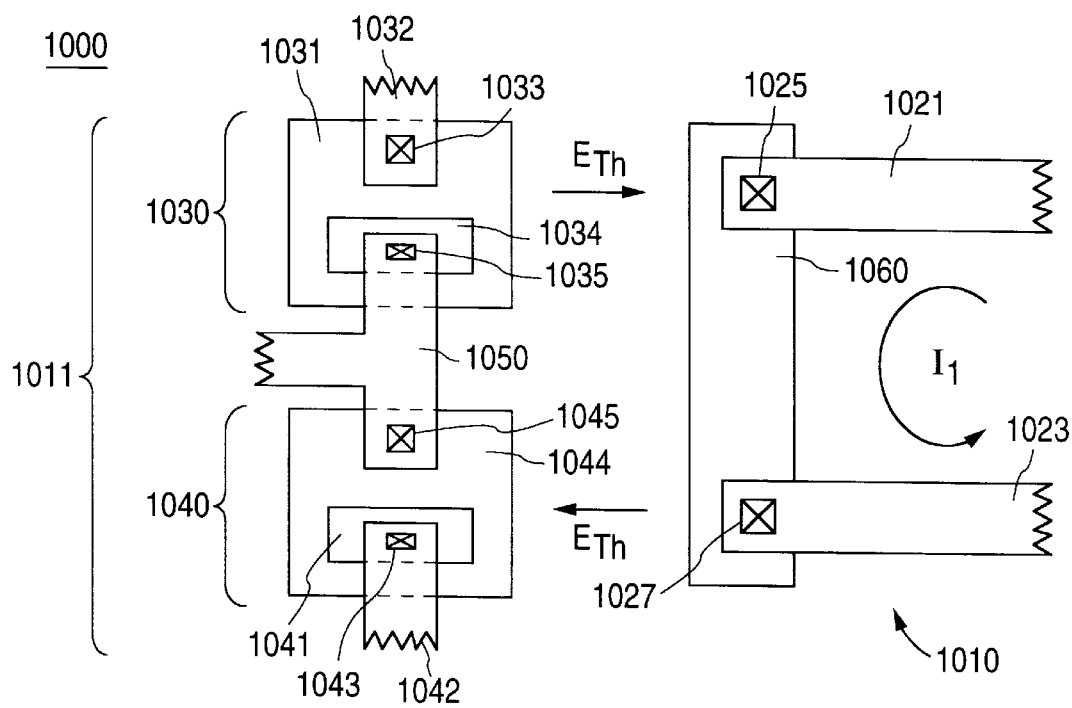
FIG. 10 shows a top view of a thermal element positioned in proximity to a pair of PN-Junctions according to another embodiment of the present invention.

FIG. 10 illustrates a thermal feedback stage 1000 in accordance with another embodiment of the present invention. Thermal feedback stage 1000 includes an thermal element 1010 comprising connection lines 1021 and 1023 and a bridge element 1060. The connection lines may be metallizations of aluminum and the bridge element may be p-type silicon, for example. The connection lines and bridge element form aluminum/p-type silicon junctions at contacts 1025 and 1027. Thermal feedback stage 1000 also includes a thermal sensing element 1011. Thermal sensing element 1011 includes first and second PN-junctions 1030 and 1040 located in proximity to the aluminum/p-type silicon junctions of thermal element 1010. The thermal signal component generated at the contact 1025 will be thermally coupled to the first PN-junction 1030 and the thermal signal component generated at the contact 1027 will be thermally coupled to the PN-junction 1040. PN-junction 1030 includes an connection line 1032 composed of an electrically conductive material such as aluminum, for example. PN-junction 1030 also includes a p-type silicon region 1031, an aluminum/p-type silicon junction at contact 1033, an n-type silicon region 1034, and a aluminum/n-type silicon junction at contact 1035 for connecting the PN-junction to an intermittant node 1050. PN-junction 1040 includes a connection line 1042 composed of aluminum, for example, an n-type silicon region 1041, an aluminum/n-type silicon junction at contact 1043, a p-type silicon region 1044, and a aluminum/p-type silicon junction at contact 1045 for connecting the PN-junction to the intermittant node 1050.

The dominant thermal effect of the thermal sensing element of FIG. 10 will result from the properties of the PN-junctions rather than the voltages generated by the Seebeck Effect. According to well-known properties of semiconductors, the forward bias voltage of a PN-junction will show a strong but highly predictable dependence on temperature. Generally the voltage across a PN-junction can be represented by the following equation:

$$V_D = V_T \ln(I_D/I_S)$$

Typically, a PN-junction with a one square mil (625 um2) junction area, biased at $I_D$=60 uA., will experience a thermal sensitivity of about −2.0 mV/° C. Therefore, as the temperature is increased in a diode, the voltage across the diode will decrease, and correspondingly, when the temperature is decreased in a diode, the voltage across the diode will increase.

Figure 11:
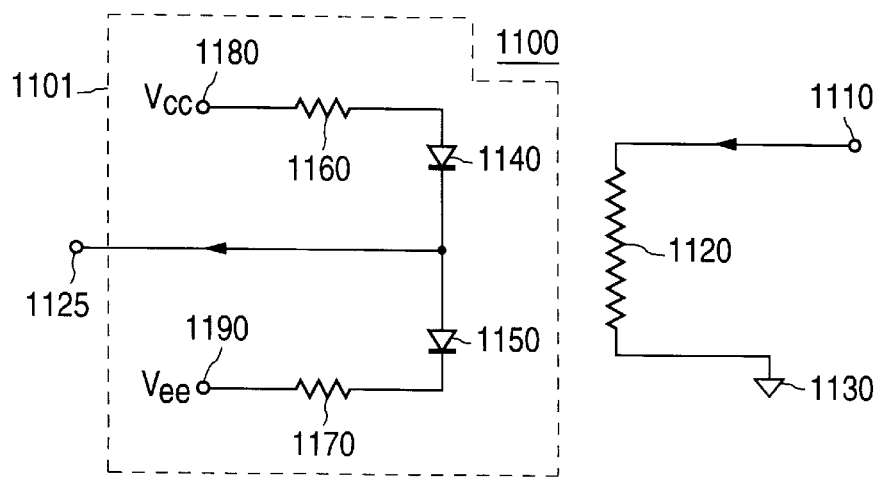
FIG. 11 is a diagram of a thermal feedback stage according to another embodiment of the present invention.

FIG. 11 shows a schematic diagram of a thermal feedback stage 1100 according to another embodiment of the present invention. Thermal feedback stage 1100 includes a feedback input node 1110 for receiving the periodic electronic output signal of the oscillator circuit. Thermal feedback stage 1100 also includes an integrated semiconductor p-type resistor 1120 that has been doped to give a desired resistivity. The p-type resistor acts as a thermal element for generating a differential thermal signal. One end of the resistor connected to the feedback input node and the other end connected to reference voltage or grounded terminal 1130. Typically, in an integrated circuit, some form of metallization will form contacts with each end of a p-type silicon region.

Thermal feedback stage 1100 also includes a thermal sensing element having first and second PN-junctions 1140 and 1150. The first PN-junction or diode 1140 is positioned to achieve thermal coupling with the aluminum/p-type silicon junction that connects feedback input node 1110 to p-type resistor 1120. The second PN-junction or diode 1150 is positioned to achieve thermal coupling with the aluminum/p-type silicon junction connecting the reference voltage or ground terminal 1130 to the other end of p-type resistor 1120. In the embodiment shown in FIG. 11 the thermal sensing diodes are connected in series and a differential voltage change in the diodes caused by the differential thermal signal is sensed at the intermittent node 1125. Additionally, the diodes are biased with a bias circuit including a pair of resistors 1160 and 1170 coupled in series with the diodes between supply voltages Vcc 1180 and Vee 1190. It should be understood that various types of configurations for biasing PN-junctions and for sensing differential voltage changes resulting from thermal changes are known in the art. The previous example should, therefore, be seen as illustrative and not limiting.

Figure 12:
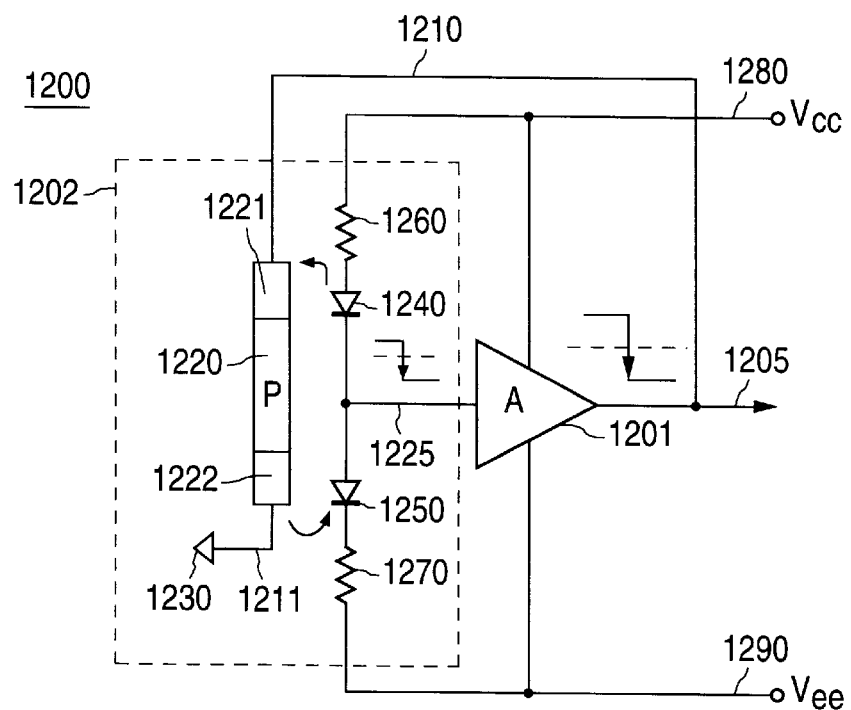
FIG. 12 is a diagram of a thermal feedback oscillator circuit during one phase of an oscillation cycle.
Figure 13:
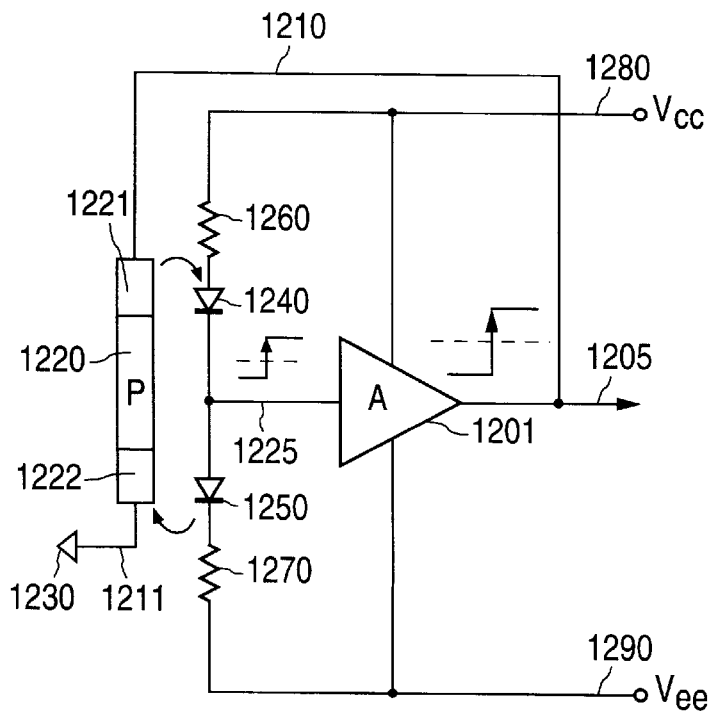
FIG. 13 is a diagram of a thermal feedback oscillator circuit during another phase of an oscillation cycle.

The behavior of a complete oscillation circuit utilizing thermal feedback can be illustrated by referring to the circuit of FIGS. 12 and 13. FIGS. 12 and 13 show the characteristics of an oscillation circuit during two alternate phases of oscillation. FIG. 12 shows an oscillation circuit 1200 that includes amplifier 1201, acting as a feed forward stage, and a thermal feedback stage 1202. Amplifier 1201 receives an input signal on intermittant input node 1225 and produces a periodic electronic output signal on output node 1205. The output of the amplifier shown in FIGS. 12 and 13 will alternately swing between the power supply voltages Vcc, which is greater than zero volts, and Vee, which is less than zero volts. The output signal is transmitted to the thermal feedback stage 1202 on connection line 1210 and input to one side of a p-type resistor 1220. The other connection line 1211 of p-type resistor 1220 is connected to a reference potential at zero volts or ground 1230. The p-type resistor contacts 1221 and 1222 are thermally coupled to series connected diodes 1240 and 1250 respectively, which are in turn connected to intermittent input node 1225 for controlling the input signal to the amplifier. The diodes are biased by a bias circuit comprised of resistors 1260 and 1270 which are connected in series with the diode between two reference voltages Vcc 1280 and Vee 1290. FIG. 12 illustrates the operation of the oscillator circuit during the phase of operation where the output node is initially at a voltage level above ground, in this case Vcc. The high voltage at the output is transmitted to the feedback stage 1202 and applied to contact 1221 of the p-type resistor. In this state, the p-type resistor has a positive voltage at contact 1221 and current will flow from the output of the amplifier, through the resistor contacts 1221 and 1222 and then to ground. As a result of the current flow, electrical energy will be translated into thermal energy according to the Peltier Effect. The junction at contact 1221 will begin to cool as thermal energy is absorbed, and the junction at 1222 will begin to heat up as thermal energy is released. The corresponding negative and positive components of the differential thermal signal will propagate to diodes 1240 and 1250 respectively, thereby reducing the temperature of diode 1240 and increasing the temperature of diode 1250. Assuming that the resistors 1260 and 1270 are of the same value and that Vcc and Vee are symmetrically above and below ground, if the input node is initially at a voltage above ground (i.e. initially above an input trip point voltage where the amplifier will change state at the output), then the initial thermal voltage drop across diode 1240 must be smaller than the thermal voltage drop across diode 1250. This means that diode 1240 will be at a higher temperature initially than diode 1250. However, in response to the negative component of the differential thermal signal, the temperature of diode 1240 will begin to decline. Likewise, in response to the positive component of the differential thermal signal, the temperature of diode 1250 will being to increase. The voltage drop across diode 1240 will increase as it is cooled, and the voltage drop across diode 1250 will decrease as it is heated. As a result, the intermittant input node voltage 1225 will decrease from a voltage above ground to a voltage below ground. If the trip point of the amplifier is at zero volts, the transition of the input from high to low will cause the amplifier output to transition from high to low.

FIG. 13 also shows the oscillator circuit of FIG. 12, but illustrates the process for the next phase of the cycle. After the output has transitioned to a voltage below ground, resistor contact 1221 will have a negative voltage with respect to resistor contact 1222 which is grounded. Therefore, current will begin to flow in the opposite direction of the prior phase of the oscillation cycle. More particularly, current will flow from ground, into resistor contact 1222, across the p-type resistor body 1220, out of the p-type body and into connection line 1210 at contact 1221, and into the output terminal of the amplifier. As a result of the direction of current flow, Peltier heating will now occur at contact 1221 and Peltier cooling will occur at contact 1222. The positive component of the differential thermal signal will emanate from terminal 1221 and thermally couple with diode 1240. As a result, the temperature of diode 1240 will begin to increase, and the voltage drop across diode 1240 will correspondingly decrease. Similarly, the negative component of the differential thermal signal will emanate from terminal 1222 and thermally couple with diode 1250. As a result, the temperature of diode 1250 will begin decrease, and the voltage drop across diode 1250 will correspondingly increase. Therefore, the voltage at the input node of amplifier 1201 will increase from below the amplifier trip point to above the amplifier trip point and the oscillator will enter the initial phase of oscillation once more.

Figure 14:
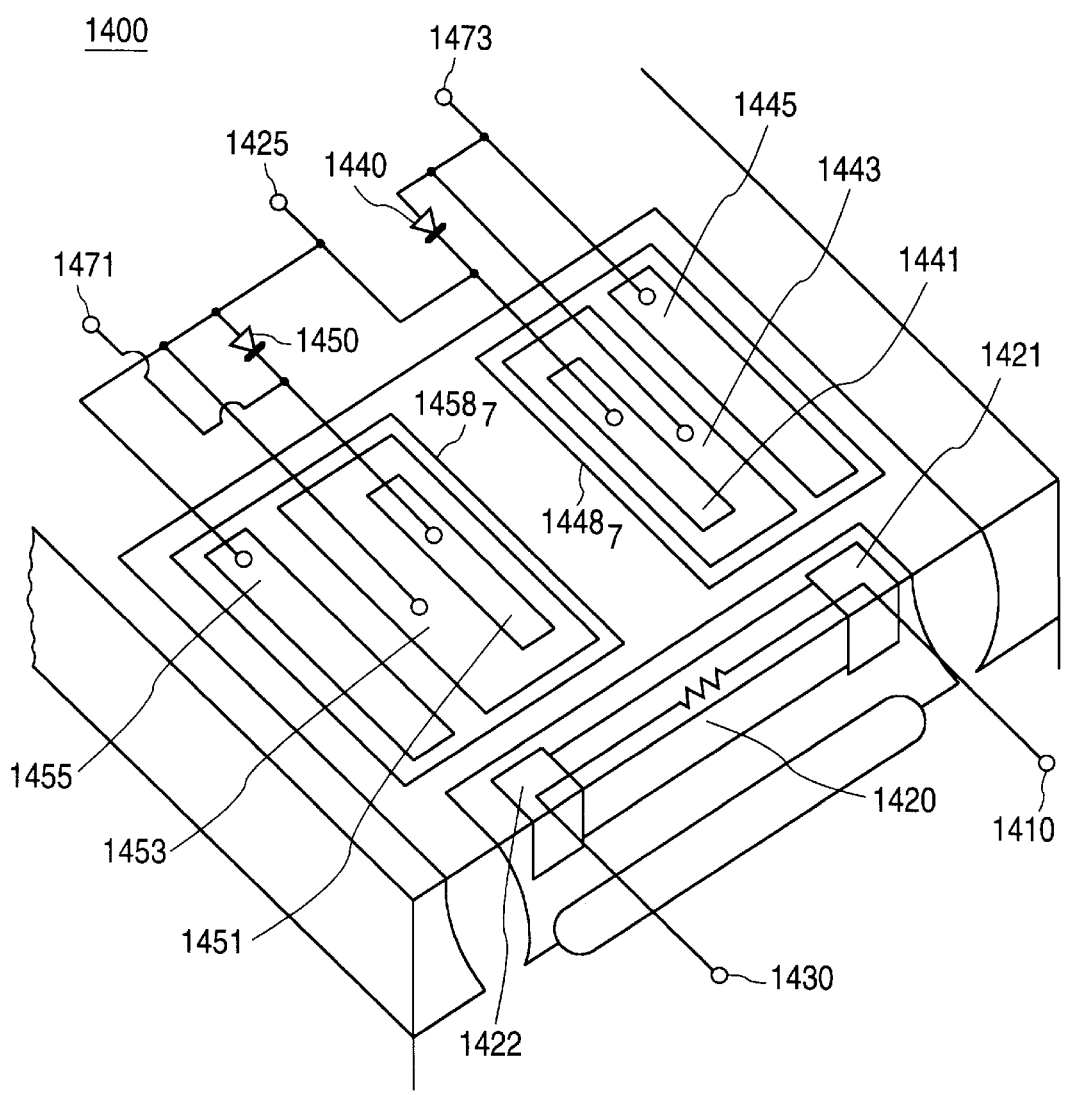
FIG. 14 is a diagram of a thermal feedback stage utilizing the emitter-base junctions of an NPN transistor as the thermal sensing elements according to another embodiment of the present invention.

FIG. 14 illustrates another embodiment of a feedback stage according to the present invention. FIG. 14 shows a feedback stage 1400 integrated onto a single semiconductor device. The integrated thermal feedback stage includes a thermal element in the form of a p-type resistor 1420. P-type resistor 1420 includes a first conductor contact 1421 for connecting the first terminal of the resistor to an electrically conductive material which can provide electrical connectivity to other parts of the circuit on connection line 1410. P-type resistor 1420 also includes a second conductor contact 1422 for connecting the second terminal of the resistor to an electrically conductive material which can also provide electrical connectivity to other parts of the circuit on connection line 1430. PN-junctions or diodes 1440 and 1450 are implemented by utilizing the emitter-base junctions of NPN transistors 1447 and 1457. NPN transistor 1447 includes an emitter 1441 connected to the intermittent node 1425, a base 1443 connected to receive an input from a bias circuit on line 1473, and a collector 1445 connected to the base 1443. NPN transistor 1457 includes an emitter 1451 connected to receive an input from a bias circuit on line 1471, a base 1453 connected to the intermittent node 1425, and a collector 1455 connected to the base 1453.

In the foregoing specification, the invention has been described with reference to specific exemplary embodiments thereof. It will, however, be evident that various modifications and changes can be made thereto without departing from the broader spirit and scope of the invention as set forth in the appended claims. The specification and drawings are, accordingly, to be regarded in an illustrative rather than restrictive sense.

What is claimed is:

1. An oscillator circuit comprising:
   a feed forward stage that produces a periodic electronic output signal on an output node in response to receiving an input signal on an input node; and
   a feedback stage coupled to the output node that produces a thermal feedback signal in response to receiving the periodic electronic output signal, wherein the thermal feedback signal is coupled to the input node to control the input signal, wherein the feedback stage includes:
   a thermal element to produce the thermal feedback signal;
   a thermal sensing element that produces an electronic feedback control signal in response to receiving the thermal feedback signal, wherein the electronic feedback control signal is coupled to the input node; and
   wherein the thermal feedback signal is a differential thermal signal corresponding to the periodic electronic output signal.

2. The oscillator circuit of claim 1, and wherein the thermal element is an integrated semiconductor resistor.

3. The oscillator circuit of claim 2, and wherein the integrated semiconductor resistor is a p-type resistor.

4. The oscillator circuit of claim 1, and wherein the thermal element comprises:
   a first connection line composed of a first electrically conducting material coupled to the output node for receiving the periodic electronic output signal;
   a bridge element of a second electrically conducting material coupled to the first connection line; and
   a second connection line composed of the first electrically conducting material coupled to the bridge element.

5. The oscillator circuit of claim 4, and wherein the first and second connection lines are metallizations on an integrated circuit, and wherein the bridge element is a doped region of silicon on the integrated circuit.

6. The oscillator circuit of claim 5, and wherein the first electrically conductive material is aluminum and the second electrically conducting material is p-type silicon.

7. The oscillator circuit of claim 1, and wherein the thermal sensing element comprises:
   a first connection line composed of a first electrically conducting material;
   a bridge element of a second electrically conducting material coupled to the first connection line; and
   a second connection line composed of the first electrically conducting material coupled to the bridge element;
   wherein said thermal sensing element is thermally coupled to the thermal element.

8. The oscillator circuit of claim 7, and wherein the first and second connection lines are metallizations on an integrated circuit, and wherein the bridge element is a doped region of silicon on the integrated circuit.

9. The oscillator circuit of claim 8, and wherein the first electrically conductive material is aluminum and the second electrically conducting material is p-type silicon.

10. The oscillator circuit of claim 1, and wherein the thermal sensing element comprises:
    a first PN-junction thermally coupled to a first component of the thermal feedback signal; and
    a second PN-junction thermally coupled to a second component of the thermal feedback signal;
    wherein the first and second PN-junctions produce said electronic feedback control signal in response to receiving the respective first and second components of the thermal feedback signal.

11. The oscillator circuit of claim 10, and wherein the periodic electronic input signal comprises the electronic feedback control signal.

12. The oscillator circuit of claim 10, and further comprising a first resistor coupled between a first voltage and a first contact of the first PN-junction, and a second resistor coupled between a second voltage and a first contact of the second PN-junction, wherein the first voltage is of a greater potential than the second voltage and wherein a second contact of the first PN-junction and a second contact of the second PN-junction are coupled to the input node to provide the periodic input signal.

13. The oscillator circuit of claim 10, and wherein the first and second PN-junctions are comprised of a first and a second emitter-base junctions of a corresponding first and second NPN transistors.

14. The oscillator circuit of claim 1, and wherein the feedback stage, in response to the periodic electronic output signal, translates electrical energy in the periodic electronic output signal into thermal energy, stores the thermal energy, and translates the thermal energy back into electrical energy in an electronic feedback control signal for controlling the electrical characteristics of the periodic electronic input signal.

15. An oscillator circuit comprising:
    means for producing a periodic electronic output signal on an output node in response to receiving an input signal on an input node and;
    feedback means for producing a thermal feedback signal in response to receiving the periodic electronic output signal, wherein the thermal feedback signal is coupled to the input node for controlling the input signal; and
    wherein the feedback means includes:
    means for generating a differential thermal signal in response to the periodic electronic output signal; and
    means for receiving the differential thermal signal and controlling the periodic input signal.

16. The oscillator circuit of claim 15, and wherein the means for receiving the differential thermal signal comprises:
    means for receiving a first portion of the differential thermal signal and producing a first voltage change;
    means for receiving a second portion of the differential thermal signal and producing a second voltage change;
    means for combining the first and second voltage changes to produce a periodic electronic feedback signal corresponding to the periodic electronic output signal.

17. The oscillator circuit of claim 15, and wherein the means for producing a periodic electronic output signal includes means for amplifying the periodic input signal.

18. In an electronic system, a method of generating a periodic electronic signal, the method comprising:
    receiving an electronic input signal on an input node;
    feeding the electronic input signal forward to produce a periodic electronic output signal;

generating a thermal signal corresponding to the periodic electronic output signal;

coupling the thermal signal to a thermal sensing element;

generating an electronic feedback signal corresponding to the thermal signal;

controlling the electronic input signal with the electronic feedback signal, and wherein feeding the electronic input signal forward further comprises amplifying the electronic input signal, and wherein generating the thermal signal comprises generating a differential thermal signal.

19. The method of claim 18, and wherein coupling the thermal signal comprises differentially coupling the differential thermal signal to first and second PN-junctions; and generating the electronic feedback signal comprises coupling a differential voltage change in the first and second PN-junctions, corresponding to the differential thermal signals, to the input node.

* * * * *